(12) United States Patent
Takahashi et al.

(10) Patent No.: US 9,061,499 B2
(45) Date of Patent: Jun. 23, 2015

(54) NEGATIVE PHOTOSENSITIVE RESIN COMPOSITION, PATTERN FORMATION METHOD, AND LIQUID DISCHARGE HEAD

(75) Inventors: Hyo Takahashi, Kawasaki (JP); Ken Ikegame, Atsugi (JP); Masako Shimomura, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 43 days.

(21) Appl. No.: 13/576,906

(22) PCT Filed: Jan. 27, 2011

(86) PCT No.: PCT/JP2011/052204
§ 371 (c)(1),
(2), (4) Date: Aug. 2, 2012

(87) PCT Pub. No.: WO2011/096458
PCT Pub. Date: Aug. 11, 2011

(65) Prior Publication Data
US 2012/0306961 A1  Dec. 6, 2012

(30) Foreign Application Priority Data

Feb. 5, 2010  (JP) .................................. 2010-024682

(51) Int. Cl.
| | | |
|---|---|---|
| G03C 1/00 | (2006.01) | |
| G03F 7/00 | (2006.01) | |
| G03F 1/00 | (2012.01) | |
| G01D 11/00 | (2006.01) | |
| B41J 2/16 | (2006.01) | |
| G03F 7/004 | (2006.01) | |
| G03F 7/038 | (2006.01) | |

(52) U.S. Cl.
CPC ............. *B41J 2/1603* (2013.01); *B41J 2/1623* (2013.01); *B41J 2/1628* (2013.01); *B41J 2/1634* (2013.01); *B41J 2/1635* (2013.01); *B41J 2/1639* (2013.01); *B41J 2/1645* (2013.01); *G03F 7/0045* (2013.01); *G03F 7/0046* (2013.01); *G03F 7/038* (2013.01)

(58) Field of Classification Search
None
See application file for complete search history.

(56) References Cited

U.S. PATENT DOCUMENTS

| | | |
|---|---|---|
| 5,218,376 A | 6/1993 | Asai |
| 5,639,802 A | 6/1997 | Neckers et al. |
| 6,155,673 A | 12/2000 | Nakajima |

(Continued)

FOREIGN PATENT DOCUMENTS

| | | |
|---|---|---|
| CN | 1195356 A | 10/1998 |
| CN | 1637052 A | 7/2005 |

(Continued)

OTHER PUBLICATIONS

U.S. Appl. No. 13/576,895, filed Aug. 2, 2012, Hyo Takahashi.

*Primary Examiner* — Stephen Meier
*Assistant Examiner* — Renee I Wilson
(74) *Attorney, Agent, or Firm* — Canon USA Inc. IP Division

(57) ABSTRACT

A photosensitive resin composition includes a cationically polymerizable compound, a photoacid generating agent having an anion portion and a cation portion, and a salt having a cation portion having either one of a quaternary ammonium structure and a quaternary phosphonium structure and an anion portion, wherein the anion portion of the salt is exchanged with the anion portion of a first acid derived from the anion portion of the photoacid generating agent to form a second acid having acid strength that is lower than acid strength of the first acid.

13 Claims, 5 Drawing Sheets

(56) References Cited

U.S. PATENT DOCUMENTS

| | | | |
|---|---|---|---|
| 2008/0153030 A1* | 6/2008 | Kobayashi et al. | ........ 430/270.1 |
| 2008/0292993 A1 | 11/2008 | Ishikura | |
| 2008/0311511 A1 | 12/2008 | Senzaki | |

FOREIGN PATENT DOCUMENTS

| | | | |
|---|---|---|---|
| CN | 101091138 A | 12/2007 |
| CN | 101334588 A | 12/2008 |
| GB | 1526923 | 10/1978 |
| JP | 51-056885 | 5/1976 |
| JP | H07-145346 A | 6/1995 |
| JP | 08-157510 A | 6/1996 |
| JP | 09-012615 A | 1/1997 |
| JP | H09-025393 A | 1/1997 |
| JP | 10-007680 A | 1/1998 |
| JP | 10-152554 A | 6/1998 |
| JP | 10-212286 A | 8/1998 |
| JP | H11-322900 A | 11/1999 |
| JP | 2000-321416 A | 11/2000 |
| JP | 2004-503392 A | 2/2004 |
| JP | 2004-131591 A | 4/2004 |
| JP | 2005-187799 A | 7/2005 |
| JP | 2006-227544 A | 8/2006 |
| JP | 2006-241384 A | 9/2006 |
| JP | 2007-034153 A | 2/2007 |
| JP | 2008-158339 A | 7/2008 |
| JP | 2008-173971 A | 7/2008 |
| JP | 2008-256980 A | 10/2008 |
| JP | 2009-244779 A | 10/2009 |
| JP | 2009244779 A | 10/2009 |
| JP | 2009-258506 A | 11/2009 |
| JP | 2009-269849 A | 11/2009 |
| JP | 2010-276623 A | 12/2010 |
| WO | 2010/001919 A1 | 1/2010 |
| WO | 2010/143560 A | 12/2010 |

* cited by examiner

NEGATIVE PHOTOSENSITIVE RESIN COMPOSITION, PATTERN FORMATION METHOD, AND LIQUID DISCHARGE HEAD

TECHNICAL FIELD

The present invention relates to a negative photosensitive resin composition. More specifically, the present invention relates to a negative photosensitive resin composition usable for production of a liquid discharge head that is used in a liquid discharge recoding method for generating a liquid droplet such as an ink droplet. Further, the present invention relates to a pattern formation method, a liquid discharge head, and a liquid discharge head production method using the negative photosensitive resin composition.

BACKGROUND ART

As a microfabrication technology, a photolithography technology for forming a pattern or a structure by performing exposure and development of a negative photosensitive resin composition has been known. The technology has been utilized widely for producing semiconductor integrated circuits, semiconductor exposure masks, and various microelectromechanical systems (MEMS), and the like. As an example of the utilization for MEMS production, the technology is applied to a production of a nozzle of a liquid discharge head. In the field of the technology, there has been a demand for producing a structure having more complicated and high definition configuration as well as high heat resistance in recent years, and, therefore, there has been a demand for a negative photosensitive resin composition that exhibits high heat resistance and molding accuracy.

As an example of the negative photosensitive resin composition, Japanese Patent Application Laid-Open No. 2008-256980 discusses a negative photosensitive resin composition containing a polyfunctional epoxy resin and a photoacid generating agent.

As an example of the liquid discharge head, U.S. Pat. No. 5,218,376 discusses a configuration including a nozzle for a liquid discharging device, wherein an ink droplet is discharged by providing communication between air bubbles generated by heating a heating resistance element and an outside air.

However, in the case of heating at a high temperature for imparting high reliability, a part of a cured film has sometimes been modified to make it impossible to obtain a desired cured film.

SUMMARY OF INVENTION

The present invention is directed to a negative photosensitive resin composition having high heat resistance and shaping accuracy. Further, the present invention is directed to a liquid discharge head having a discharge port member provided with discharge ports formed from the composition and having high-definition shape.

According to an aspect of the present invention, there is provided a photosensitive resin composition including a cationically polymerizable compound; a photoacid generating agent having an anion portion and a cation portion; and a salt having a cation portion having either one of a quaternary ammonium structure and a quaternary phosphonium structure and an anion portion, wherein the anion portion of the salt is exchanged with the anion portion of a first acid derived from the anion portion of the photoacid generating agent to form a second acid having acid strength that is lower than acid strength of the first acid.

According to exemplary embodiments of the present invention, there is provided a negative photosensitive resin composition having high heat resistance and capable of forming a cured matter having good molding accuracy. Further, it is possible to provide a liquid discharge head having a discharge port member provided with high-definition shape discharge ports.

Further features and aspects of the present invention will become apparent from the following detailed description of exemplary embodiments with reference to the attached drawings.

BRIEF DESCRIPTION OF DRAWINGS

The accompanying drawings, which are incorporated in and constitute a part of the specification, illustrate exemplary embodiments, features, and aspects of the invention and, together with the description, serve to explain the principles of the invention.

DESCRIPTION OF EMBODIMENTS

Figure 1:
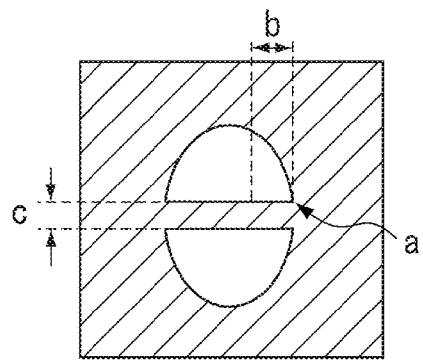
FIG. 1 is a diagram schematically illustrating a pattern to be used for evaluating molding accuracy according to an exemplary embodiment of the present invention.

Various exemplary embodiments, features, and aspects of the invention will be described in detail below with reference to the drawings.

A negative photosensitive resin composition according to an exemplary embodiment of the present invention contains: (a) an acid-polymerizable compound; (b) at least one photoacid generating agent; and (c) a salt exchanging agent, wherein the salt exchanging agent is a salt having a cation portion having either one of a quaternary ammonium structure and a quaternary phosphonium structure and an anion portion.

Hereinafter, the components of the negative photosensitive resin composition according to the exemplary embodiment of the present invention will be described in detail.

<(a) Cationically Polymerizable Compound>

Examples of the acid-polymerizable compound include, but not limited to, a compound having one or two or more reactive functional groups selected from the group consisting of an epoxy group, an oxetane group, a vinylether group, and a propenylether group.

Among them, the polyfunctional epoxy compound having a plurality of epoxy groups in one molecule is preferred. Examples of the polyfunctional epoxy resin include a polyfunctional alicyclic epoxy resin, a polyfunctional phenol novolac epoxy resin, a polyfunctional ortho-cresol novolac epoxy resin, a polyfunctional triphenyl novolac epoxy resin, a polyfunctional bisphenol-A novolac epoxy resin, and the like. Among them, the polyfunctional bisphenol-A novolac epoxy resin, the polyfunctional alicyclic epoxy resin, or the polyfunctional phenol novolac epoxy resin may be preferably used. The functionality may be preferably pentafunctional or more, and, for example, "Epicoat 157S70" manufactured by Japan Epoxy Resin Co., Ltd., "Epiclon N-865" manufactured by DIC Corporation, and "EHPE 3150" manufactured by Daicel Chemical Industries, Ltd., are commercially available and may be more preferably used.

A softening point of the polyfunctional epoxy resin may be preferably, but not limited to, 50° to 180° C., more preferably 60° to 160° C.

A content of the polyfunctional epoxy resin may be preferably 40 mass % (percent by mass) to 99.9 mass %, more preferably 45 mass % to 99.9 mass %, further preferably 50 mass % to 99.2 mass %. With the content, it is possible to obtain a resist layer having an appropriate hardness when applied on a support body.

As the compound having oxetane group, any compound having at least one oxetane ring may be used. Examples of the compound having oxetane group include a bisphenol-A oxetane compound, a bisphenol oxetane compound, a bisphenol-S oxetane compound, a xylylene oxetane compound, a phenol novolac oxetane compound, a cresol novolac oxetane compound, an alkylphenol novolac oxetane compound, a biphenol oxetane compound, a bixylenol oxetane compound, a naphthalene oxetane compound, a dicyclopentadiene oxetane compound, an oxetane compound which is a condensation product of a phenol and an aromatic aldehyde having a phenolic hydroxide group, and the like.

More specific examples of the compound having oxetane group include compounds represented by the following chemical formula:

[Chem. 1]

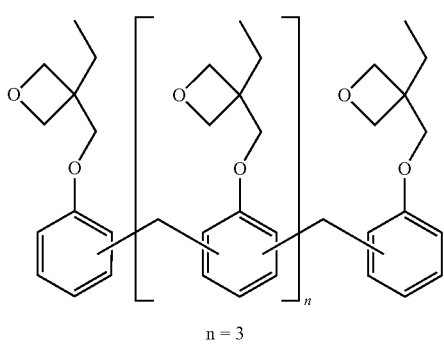

n = 3

[Chem. 2]

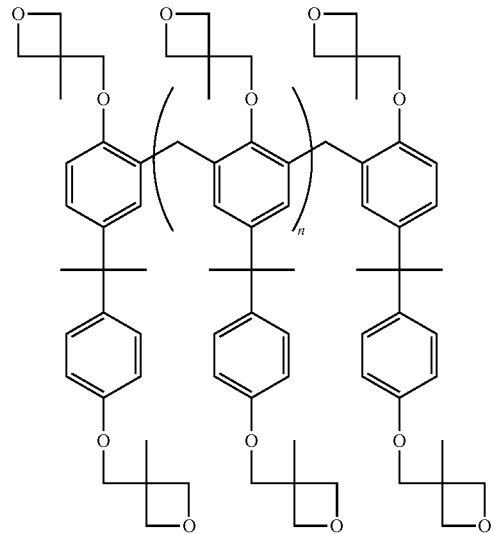

wherein n is an integer of 1 to 20.

Examples of the compound having vinylether (hereinafter abbreviated to VE) group include monofunctional VE such as monofunctional VE [having 3 or more carbon atoms (C3 or more) and a number average molecular weight (Mn) of 1,000 or less, such as alkyl VE (methyl VE, ethyl VE, butyl VE, isobutyl VE, cyclohexyl VE, 2-chloroethyl VE, 2-phenoxyethyl VE, 2-hydroxyethyl VE, 4-hydroxybutyl VE, stearyl VE, 2-acetoxyethyl VE, diethyleneglycol mono-VE, 2-ethylhexyl VE, dodecyl VE, octadecyl VE, etc.), alkenyl VE (allyl VE, 2-methacryloyloxyethyl VE, 2-acroyloxyethyl VE, etc.), aryl VE (phenyl VE, p-methoxyphenyl VE, etc.)], polyfunctional VE (C6 or more and Mn of 1,000 or less, such as 1,4-butanediol di-VE, triethyleneglycol di-VE, 1,4-benzene di-VE, hydroquinone di-VE, cyclohexanedimethanol di-VE, diethyleneglycol di-VE, dipropylene di-VE, hexanediol di-VE, etc.), and the like.

Examples of the compound having propenylether group (hereinafter abbreviated to PPE) include polyfunctional PPE [C4 or more and Mn of 1,000 or less, such as alkyl PPE (methyl PPE, ethyl PPE, butyl PPE, isobutyl PPE, cyclohexyl PPE, 2-chloroethyl PPE, 2-phenoxyethyl PPE, 2-hydroxyethyl PPE, 4-hydroxybutyl PPE, stearyl PPE, 2-acetoxyethyl PPE, diethyleneglycol mono-PPE, 2-ethylhexyl PPE, dodecyl PPE, octadecyl PPE, etc.), alkenyl PPE (allyl PPE, 2-methacryloyloxyethyl PPE, 2-acroyloxyethyl PPE, etc.), aryl PPE (phenyl PPE, p-methoxyphenyl PPE, etc.), polyfunctional PPE (C6 or more and Mn of 1,000 or less, such as 1,4-butanediol di-PPE, triethyleneglycol di-PPE, 1,4-benzene di-PPE, hydroquinone di-PPE, cyclohexanedimethanol di-PPE, diethyleneglycol di-PPE, dipropylene di-PPE, hexanediol di-PPE, etc.), and the like.

<(b) Photoacid Generating Agent>

The component (b) is a substance that is decomposed after sensing light to directly or indirectly generate acid. Insofar as the photoacid generating agent has the above property, the type, structure, and the like thereof are not particularly limited. The acid generated from the photoacid generating agent has an effect of starting or accelerating a polymerization reaction. Further, the acid includes a cation.

Examples of the photoacid generating agent of the component (b) include a sulfonic acid compound and other sulfonic acid derivatives, a diazomethane compound, a sulfonium salt compound, an iodonium salt compound, a sulfonimide compound, a disulfone compound, a nitrobenzyl compound, a benzointosylate compound, an iron arene complex, a halogen-containing triadine compound, an acetophenone derivative compound, a cyano group-containing oxime sulfate, and the like. Any one of conventionally-known or conventionally-used photoacid generating agents may be used in the present invention without any particular limitation.

More preferred examples of the photoacid generating agent include the sulfonium salt compound and the iodonium salt compound. From the viewpoint of heat resistance, a monoarylsulfonium salt, a diarylsulfonium salt, and a triarylsulfonium salt having one or more aryl groups at a cation portion may be preferably used as the sulfonium salt compound. As the iodonium salt compound, a diaryliodonium salt may be preferably used.

Further preferred examples of the photoacid generating agent include the monoarylsulfonium salt, diarylsulfonium salt, triarylsulfonium salt, and diaryliodonium salt from the view point of generating an acid having acid strength that is sufficiently curing the epoxy resin. As to the acid strength sufficiently curing the epoxy resin, a strong acid such as a hexafluoroantimonic acid or an acid stronger than hexafluoroantimonic acid are preferred among Lewis acids. "Strong acid such as hexafluoroantimonic acid or acid stronger than hexafluoroantimonic acid" means an acid having a value of Hammette acidity function-HO that is equal to or larger than 18. Among Bronsted acids, a strong acid such as a nonafluorobutanesulfonic acid or an acid stronger than nonafluorobutanesulfonic acid are preferred. "Strong acid equal to or stronger than nonafluorobutanesulfonic acid" means an acid having a value of PKa that is equal to or larger than −3.57. Hereinafter, specific examples of an anion portion structure in a sulfonium salt and an iodonium salt to be a generation source of the strong acid will be described. However, the compounds are not more than examples, and the present invention is not limited to the exemplified compounds.

[Chem. 3]

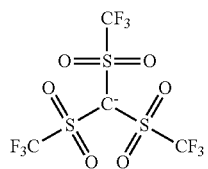
(b-1)

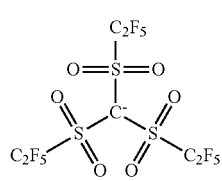
(b-2)

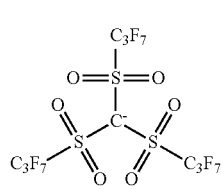
(b-3)

-continued

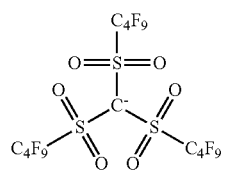
(b-4)

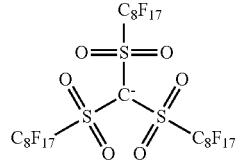
(b-5)

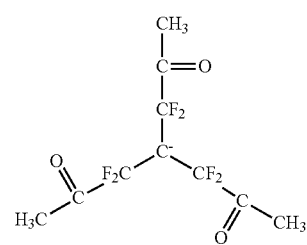
(b-6)

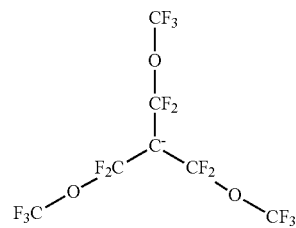
(b-7)

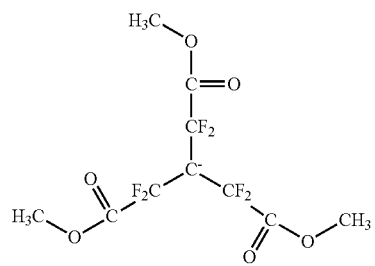
(b-8)

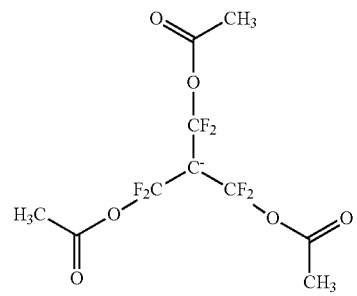
(b-9)

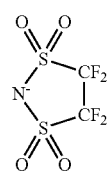
(b-10)

(b-11) 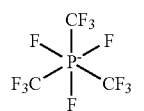

(b-12) 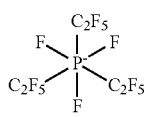

(b-13) 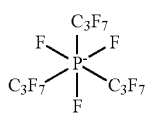

(b-14) 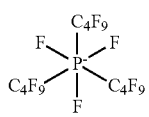

(b-15) 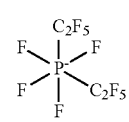

(b-16) 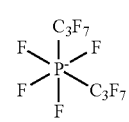

(b-17) 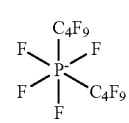

(b-18) 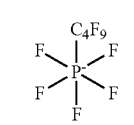

(b-19) 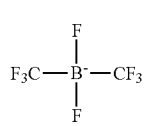

(b-20) 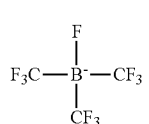

(b-21) 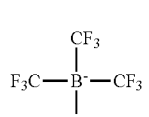

(b-22) 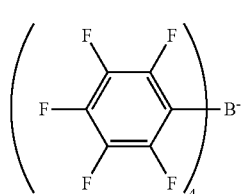

(b-23) $SbF_6^-$

[Chem. 4]

(b-24) $CF_3SO_3^-$ (b-25) $C_2F_5SO_3^-$ (b-26) $C_3F_7SO_3^-$ (b-27) $C_4F_9SO_3^-$ (b-28) 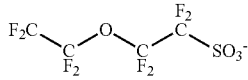

(b-29) $C_6F_{13}SO_3^-$ (b-30) $C_8F_{17}SO_3^-$

Most preferred examples of the anion portion structure include (b-1) to (b-14) among the above examples. It is possible to obtain a cured matter with high molding accuracy by using the anion portion structure that is the generation source of stronger acid.

The above-described components (b) may be used alone or in combination of two or more. A content of the component (b) may be ordinarily 0.01 to 20 mass %, preferably 0.1 to 15 mass %, more preferably 0.15 to 10 mass %.

<(c) Salt Exchanging Agent>

The salt exchanging agent is a quaternary ammonium salt or a quaternary phosphonium salt that is capable of forming a second acid having acid strength lower than that of a first acid when exchanged with an anion portion of the first acid derived from the anion portion of the photoacid generating agent after the photoacid generating agent is resolved by sensing light. The type, structure, and the like thereof are not particularly limited insofar as the salt exchanging agent has the above-described property. It is possible to select the salt exchanging agent by comparing the anion portion of the photoacid generating agent (b) and the anion portion of the salt exchanging agent (c) and using acid strengths obtained by converting the anion portions into acids as criteria. More specifically, a compound satisfying the following Formula <1> is capable of capturing the acid (first acid) generated from the photoacid generating agent (b) and discharging the acid (second acid) having lower acid strength than the captured acid and is usable as the salt exchanging agent in the present invention. "Anion portion" means a unit containing a symbol expressed by "−" as a negative charge, and "conversion into acid" means addition of $H^+$ to the anion portion. In Formula <1>, the acid strength on the left of > is stronger, and the acid strength on the right of > is weaker.

[acid strength when anion portion of photoacid generating agent (b) is converted into acid]>[acid strength when anion portion of salt exchanging agent is converted into acid]  <1>

It is possible to use physical property values indicating acid strength, such as the Hammette acidity function and PKa, to express the acid strengths. Likewise, actual measurement values may be used. As a method for the measurement, it is possible to detect the acid strengths by actually subjecting photosensitive resin compositions using the photoacid generating agent in which cation portions are the same and anion portions are varied to exposure and comparing the sensitivities. In short, the photoacid generating agent that is more sensitive has the higher acid strength. Details of the measurement method will be described in <Evaluation> described below in this specification.

As a reaction principle relating to the salt exchange, an image diagram is illustrated in the following Formula <2>.

[Chem. 5]

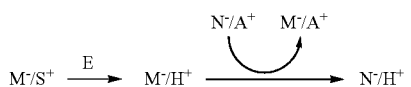

<2>

$M^-/S^+$ represents the photoacid generating agent (b); E represents a process of irradiation with energy light; $M^-/H^+$ represents the acid generated from the photoacid generating agent (b) after the light exposure; and $N^-/A^+$ represents the salt exchanging agent (c). Here, a relationship of [acid strength of $M^-/H^+$]>[acid strength of $N^-/H^+$] is established. In short, $M^-/H^+$ represents the strong acid and $N^-/H^+$ represents the weak acid in Formula <2> for convenience.

The unit having the sign "−" represents the anion portion, and the unit having the sign "+" represents the cation portion. In short, the photoacid generating agent (b) and the salt exchanging agent (c) are counter ion salts in which the anion portion and the cation portion are 1:1 in Formula <2>. As one specific example: $S^+$ is triphenylsulfonium; $A^+$ is tetraalkylammonium, $M^-$ is (b-1) described above, and $N^-$ is pentafluoroantimonate.

In Formula <2>, the acid $M^-/H^+$ generated from the photoacid generating agent is converted into $N^-/H^+$ which is a weaker acid when the acid $M^-/H^+$ encounters $N^-/A^+$ which is the salt exchanging agent (c) during PEB (Post-Exposure Baking) which is a process for performing image formation by diffusion of generated acid and a heat treatment (post-baking) after development. This is the chemical phenomenon called "salt exchange".

In the case of heating a negative photosensitive resin cured matter at a high temperature for imparting high reliability with the conventional technologies, there has been the issue of insufficient heat resistance that sometimes entails modification of a cured film resulting in failure in obtaining a desired cured film. The inventors of the present invention have discovered that the cause of the failure is the combination of the presence of strong acid and the high temperature heating to find that it is possible to improve heat resistance of the cured film by converting the acid generated from the acid generator (b) into an acid having lower acid strength and a stable salt by using the salt exchanging agent. The stable salt means $M^-/A^+$ which is a salt compound formed after the acid generated from the photoacid generating agent (b) is entrapped by the salt exchanging agent (c) and does not modify the cured film since it is stable at high temperatures.

In contrast, it is desirable to use the acid having high acid strength for polymerization to attain the high molding accuracy. Thus, since the molding accuracy and the heat resistance have the trade-off relationship, it has been difficult to attain both of the properties. However, the solution is provided by using the salt exchange reaction of the present invention.

As the salt exchanging agent (c), the following Structural Formula (1) is preferred.

[Chem. 6]

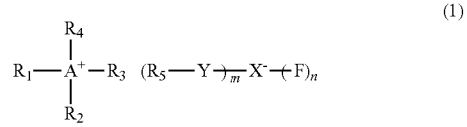

(1)

A represents a nitrogen atom or a phosphor atom; $R_1$ to $R_4$ represent an aryl group having 6 to 30 carbon atoms in total, a heterocyclic group having 4 to 30 carbon atoms in total, an alkyl group having 1 to 30 carbon atoms in total, an alkenyl group having 2 to 30 carbon atoms in total, and an alkynyl group having 2 to 30 carbon atoms in total, each of which may be substituted by at least one specie selected from the group consisting of an alkyl group, a hydroxyl group, a cycloalkyl group, an alkenyl group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a hetero atom-containing aromatic ring group, an aryloxy group, an alkylsulfinyl group, an arylsulfinyl group, an alkylsulfonyl group, an arylsulfonyl group, an alkyleneoxy group, an amino group, a cyano group, a nitro group, and a halogen group. More specific examples of the substituent groups include an alkyl group having 1 to 6 carbon atoms (for example, methyl group, ethyl group, propyl group, isopropyl group, and butyl group), a hydroxyl group, a cycloalkyl group having 3 to 6 carbon atoms (for example, cyclopropyl group, cyclobutyl group, cyclopentyl group, and cyclohexyl group), an alkenyl group having 2 to 6 carbon atoms (for example, vinyl group, 1-propenyl group, 2-propenyl group, and 2-butenyl group), an alkynyl group having 2 to 6 carbon atoms (for example, acetylenyl group, 1-propynyl group, 2-propynyl group, and 2-butynyl group), an alkoxy group having 1 to 6 carbon atoms (for example, methoxy group, ethoxy group, n-propoxy group, iso-propoxy group, n-butoxy group, and tert-butoxy group), an alkylcarbonyl group having 2 to 6 carbon atoms, an arylcarbonyl group having 7 to 11 carbon atoms, an alkoxycarbonyl group having 2 to 6 carbon atoms (for example, methoxycarbonyl group, ethoxycarbonyl group, and tert-butoxycarbonyl group), an aryloxycarbonyl group having 7 to 11 carbon atoms, an arylthiocarbonyl group having 7 to 11 carbon atoms, an acyloxy group having 2 to 6 carbon atoms, an arylthio group having 6 to 10 carbon atoms (for example, phenylthio group and naphthylthio group), an alkylthio group having 1 to 6 carbon atoms (for example, methylthio group, ethylthio group, n-propylthio group, iso-propylthio group, n-butylthio group, and tert-butylthio group), an aryl group having 6 to 14 carbon atoms (for example, phenyl group, naphthyl group, and anthracenyl group), a hetero atom-containing aromatic ring group having 4 to 8 carbon atoms (for example, furyl group and thienyl group), an aryloxy group having 6 to 10 carbon atoms (for example, phenoxy group and naphthoxy group), an alkylsulfinyl group having 1 to 6 carbon atoms, an arylsulfinyl group having 6 to 10 carbon atoms, an alkylsulfonyl group having 1 to 6 carbon atoms, an arylsulfonyl group having 6 to 10 carbon atoms, an alkyleneoxy group having 1 to 6 carbon atoms, an amino group, a cyano group, a nitro group, a halogen group (for example, chlorine atom, bromine atom, fluorine atom), and the like. $R_1$ to $R_4$ may be the same or different. Further, if A is the nitrogen atom, $R_1$ and $R_4$ may form a double bond to form $R_2$—$N^+$(=$R_6$)—$R_3$. Further, two or more of $R_1$ to $R_4$ and $R_6$ may form a ring structure having a single ring or a plurality of rings via a carbon atom, an oxygen atom, a sulfur atom, or a nitrogen atom. In the case of forming the ring structure, the ring structure may have one or more double bonds and may be a heterocyclic ring or an aromatic ring containing a nitrogen atom.

X is selected from a nitrogen atom, a phosphor atom, an antimony atom, a boron atom, and an oxygen atom. If X is the nitrogen: m+n is 2; n is an integer selected from 0 and 1; and Y is selected from —S(=O)$_2$—, an alkylene fluoride group, —O—CF$_2$—, —C(=O)—CF$_2$—, —O—C(=O)—CF$_2$—, —C(=O)—O—CF$_2$—, and a single bond. R$_5$ represents a hydrocarbon group having 1 to 30 carbon atoms, which may be substituted by a fluorine atom, and the hydrocarbon group has at least one fluorine atom if n is 0 and Y is selected from —S(=O)$_2$— or the single bond. If X is the phosphor atom or an antimony atom: m+n is 6; n is an integer selected from 0 to 6; and Y is selected from —S(=O)$_2$—, —O—CF$_2$—, —C(=O)—CF$_2$—, —O—C(=O)—CF$_2$—, —C(=O)—O—CF$_2$—, —O—, and a single bond. R$_5$ represents a group selected from a hydrocarbon group which may be substituted by a fluorine atom and has 1 to 30 carbon atoms and a hydrogen atom, and the hydrocarbon group has at least one fluorine atom if n is 0 and Y is selected from —S(=O)$_2$—, —O—, or the single bond. If X is the boron atom: m+n is 4; n is an integer selected from 0 to 4; and Y is selected from —S(=O)$_2$—, —O—CF$_2$—, —C(=O)—CF$_2$—, —O—C(=O)—CF$_2$—, —C(=O)—O—CF$_2$—, a phenylene group that may be fluorine-substituted, and a single bond. R$_5$ represents a group selected from a hydrocarbon group which may be substituted by a fluorine atom and has 1 to 30 carbon atoms, a fluorine atom, and a hydrogen atom, and the hydrocarbon group has at least one fluorine atom if n is 0 and Y is selected from —S(=O)$_2$— or the single bond. If X is the oxygen atom: m is 1; n is an integer of 0; and Y is selected from —S(=O)$_2$— and —C(=O)—. R$_5$ represents a hydroxide group, a chlorine atom, or a hydrocarbon group which may be substituted by a fluorine atom and has 1 to 30 carbon atoms. If X is the oxygen atom, R$_3$ and R$_5$ may be linked via a hydroxide group or a hydrocarbon group which may be substituted by a chlorine atom and has 1 to 30 carbon atoms to form an intramolecular salt.

A part of specific examples of the salt exchanging agent (c) are given below. However, the compounds are not more than examples and are not limitative.

[Chem. 7]

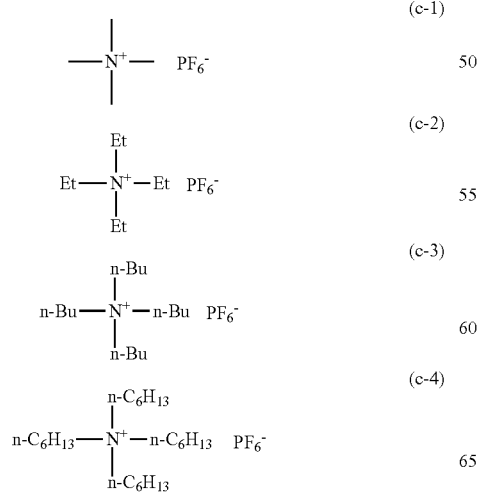

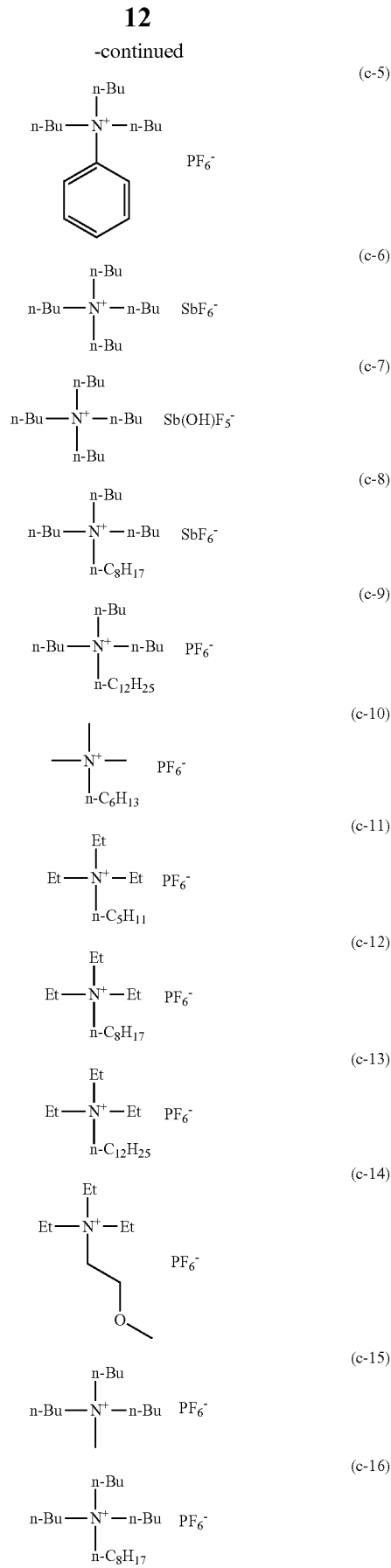

-continued
(c-17) 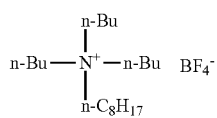 BF₄⁻
(c-18) 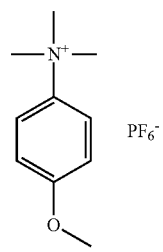 PF₆⁻
(c-19) 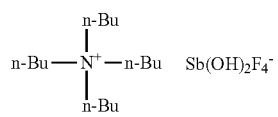 Sb(OH)₂F₄⁻
(c-20) 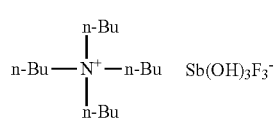 Sb(OH)₃F₃⁻
(c-21) 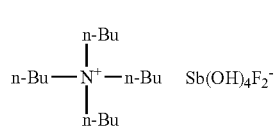 Sb(OH)₄F₂⁻
(c-22) 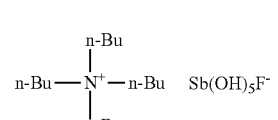 Sb(OH)₅F⁻
(c-23) 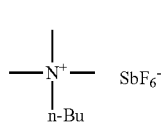 SbF₆⁻
(c-24) 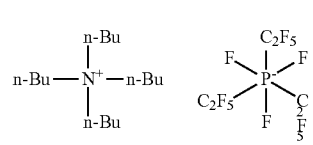
(c-25) 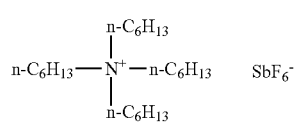 SbF₆⁻
(c-26) 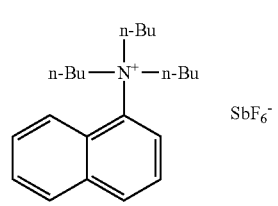 SbF₆⁻
(c-27) 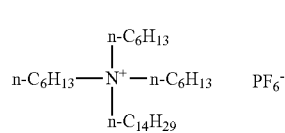 PF₆⁻
[Chem. 8]
(c-28) 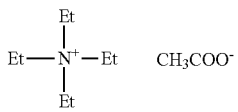 CH₃COO⁻
(c-29) 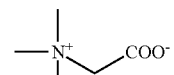
(c-30) 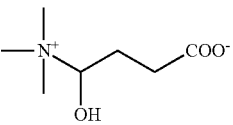
(c-31) 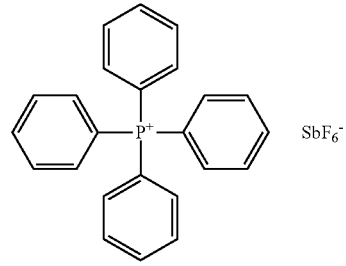 SbF₆⁻
(c-32) 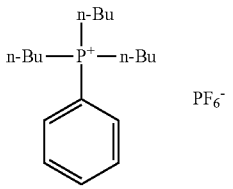 PF₆⁻
(c-33) 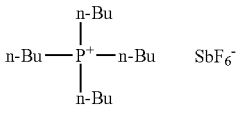 SbF₆⁻
(c-34) 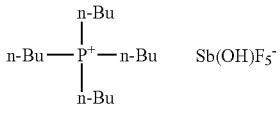 Sb(OH)F₅⁻
(c-35) 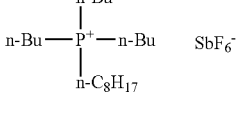 SbF₆⁻
(c-36) 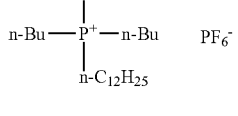 PF₆⁻
(c-37) 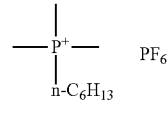 PF₆⁻
(c-38) 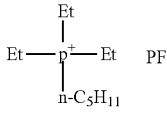 PF₆⁻

-continued
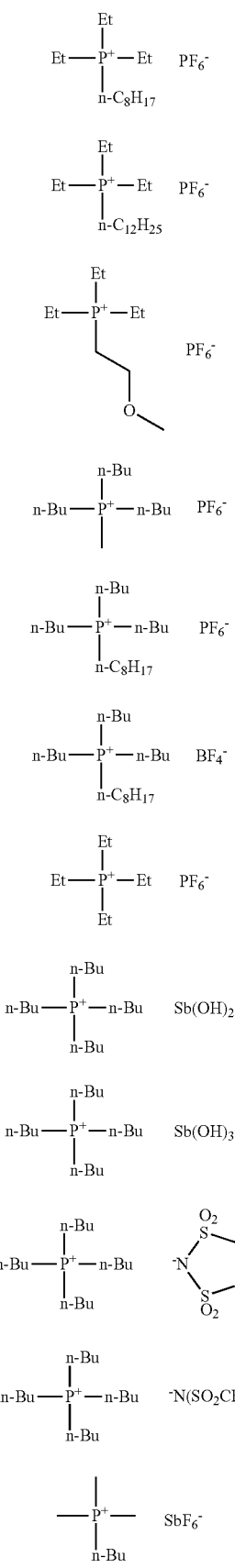
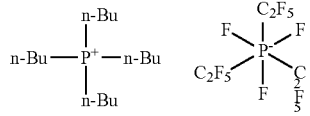
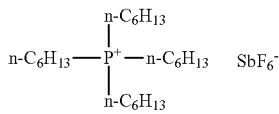
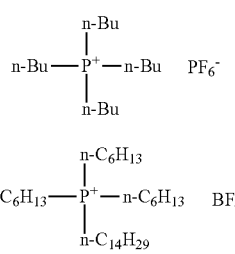
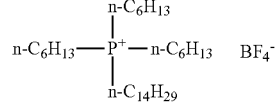
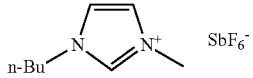
[Chem. 9]
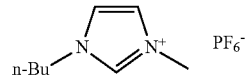
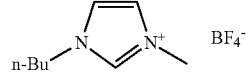
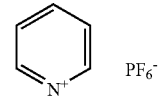
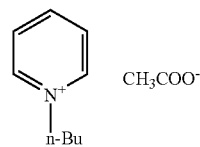
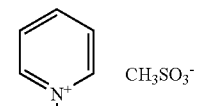
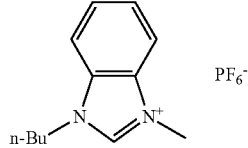
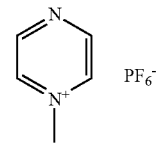

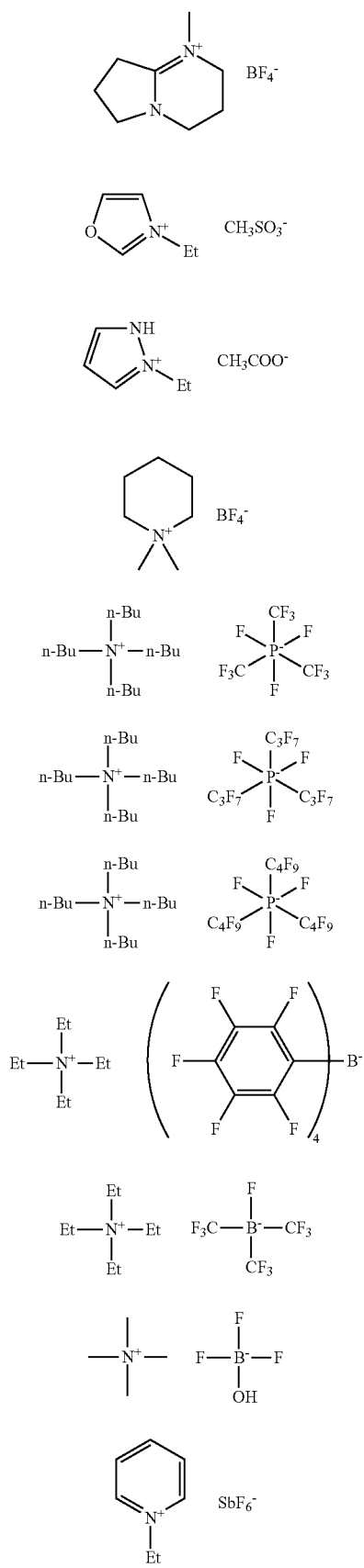
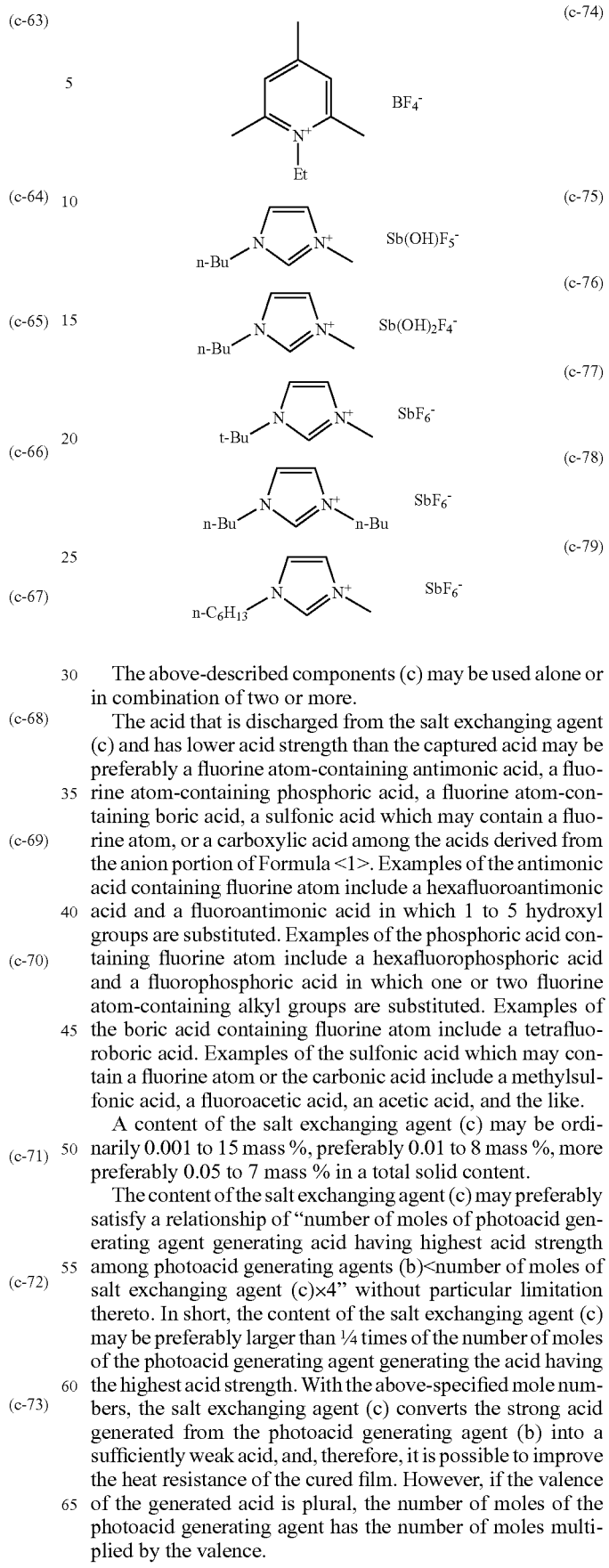

The above-described components (c) may be used alone or in combination of two or more.

The acid that is discharged from the salt exchanging agent (c) and has lower acid strength than the captured acid may be preferably a fluorine atom-containing antimonic acid, a fluorine atom-containing phosphoric acid, a fluorine atom-containing boric acid, a sulfonic acid which may contain a fluorine atom, or a carboxylic acid among the acids derived from the anion portion of Formula <1>. Examples of the antimonic acid containing fluorine atom include a hexafluoroantimonic acid and a fluoroantimonic acid in which 1 to 5 hydroxyl groups are substituted. Examples of the phosphoric acid containing fluorine atom include a hexafluorophosphoric acid and a fluorophosphoric acid in which one or two fluorine atom-containing alkyl groups are substituted. Examples of the boric acid containing fluorine atom include a tetrafluoroboric acid. Examples of the sulfonic acid which may contain a fluorine atom or the carbonic acid include a methylsulfonic acid, a fluoroacetic acid, an acetic acid, and the like.

A content of the salt exchanging agent (c) may be ordinarily 0.001 to 15 mass %, preferably 0.01 to 8 mass %, more preferably 0.05 to 7 mass % in a total solid content.

The content of the salt exchanging agent (c) may preferably satisfy a relationship of "number of moles of photoacid generating agent generating acid having highest acid strength among photoacid generating agents (b)<number of moles of salt exchanging agent (c)×4" without particular limitation thereto. In short, the content of the salt exchanging agent (c) may be preferably larger than ¼ times of the number of moles of the photoacid generating agent generating the acid having the highest acid strength. With the above-specified mole numbers, the salt exchanging agent (c) converts the strong acid generated from the photoacid generating agent (b) into a sufficiently weak acid, and, therefore, it is possible to improve the heat resistance of the cured film. However, if the valence of the generated acid is plural, the number of moles of the photoacid generating agent has the number of moles multiplied by the valence.

Further, a relationship of "number of moles of photoacid generating agent generating acid having highest acid strength among photoacid generating agents (b)<number of moles×2 of salt exchanging agent (c)" may be more preferably satisfied. In short, the content of the salt exchanging agent (c) may be more preferably larger than ½ times of the number of moles of the photoacid generating agent generating the acid having the highest acid strength. Further, a relationship of "number of moles of photoacid generating agent generating acid having highest acid strength among photoacid generating agents (b)<number of moles of salt exchanging agent (c)" may be particularly preferably satisfied. In short, the content of the salt exchanging agent (c) may particularly preferably be larger than the number of moles of the photoacid generating agent generating the acid having the highest acid strength.

Further, the content of salt exchanging agent (c) may be preferably smaller than 20 times of the number of moles of the photoacid generating agent generating the acid having the highest acid strength. By maintaining the content of the salt exchanging agent (c) within the above-specified range, it is possible to easily prevent a reduction of sensitivity and deterioration of coating property.

From the viewpoints of the heat resistance, molding accuracy, and sensitivity, the photoacid generating agent (b) and the salt exchanging agent (c) may be used in appropriate combination with the above-described acid strength within an equivalence relationship. If the heat resistance is emphasized, it is preferable to select the salt exchanging agent (c) generating a weaker acid as the salt exchanging agent. In this case, the degree of weak acid is adjusted so that a preferable sensitivity range is attained. If a balance between the molding accuracy and the heat resistance is emphasized, it is preferable to select the photoacid generating agent generating a stronger acid as the photoacid generating agent (b) and to select the salt exchanging agent generating a weaker acid as the salt exchanging agent (c). In this case, it is desirable to select the salt exchanging agent (c) in view of weakness of the weaker acid so that a preferable sensitivity range is attained. Further, if the sensitivity is emphasized, it is preferable to select the photoacid generating agent generating a stronger acid as the photoacid generating agent (b) and to select the salt exchanging agent generating a weaker acid as the salt exchanging agent (c). In this case, it is desirable to select the salt exchanging agent (c) in view of strength of the stronger acid so that a preferable heat resistance range is attained.

In the negative resin composition of the present invention, it is possible to obtain the cured matter exhibiting good molding accuracy and heat resistance by containing (a) the acid-polymerizable compound, (b) the photoacid generating agent, and (c) salt exchanging agent, and the following additives may be added as required for improving various properties. The additives are not more than examples and not limited to the following compounds.

<(d) Amine Compound>

An amine compound refers to a basic compound containing a nitrogen atom and exhibits basicity derived from an isolated electron pair of the nitrogen atom. As a function of the amine compound, the amine compound is capable of entrapping the acid generated from the photoacid generating agent, for example, and inactivating the acidity. Therefore, it is possible to improve pattern resolution by controlling an acid diffusion length during a process of diffusing acid by heat, and it is possible to suppress a sensitivity change during storage of a photosensitive resin composition solution by inactivating a very small amount of acid generated from the photoacid generating agent by a dark reaction during the storage.

As the amine compound, the amine compound having two or more nitrogen atoms in different chemical environments is preferred without particular limitation thereto. Particularly, a compound containing at least one substituted or unsubstituted amino group and at least one nitrogen atom-containing ring structure is preferred, and, further, a compound having at least one alkylamino group is preferred.

Examples of the amine compound include guanidine, pyridine, pyrrolidine, indazole, imidazole, pyrazole, pyrazine, pyrimidine, purine, imidazoline, pyrazoline, piperidine, piperidine, morpholine, and the like. These compounds may be substituted. Examples of the substituent group include an amino group, an aminoalkyl group, an alkylamino group, an aminoaryl group, an arylamino group, an alkyl group, an alkoxy group, an acyl group, an allyloxy group, an aryl group, an aryloxy group, a nitro group, a hydroxyl group, a cyano group, and the like.

Other examples of the amine compound include tertiary amines such as triphenylamine, triethanolamine, triisopropylamine, triisopropanolamine, N,N-diethyl-3-aminophenol, N-ethyldiethanolamine, and 2-diethylaminoethanol; secondary amines such as ethanolamine, diisopropanolamine, and N-methylbenzylamine; primary amine such as monomethyl; diamine such as ethylenediamine; a pyrimidine compounds and derivatives thereof such as aminepyrimidine, 2-aminopyrimidine, 4-aminopyrimidine, and 5-aminopyrimidine; a pyridine compounds and derivatives thereof such as pyridine, methylpyridine, 2,6-dimethylpyridine; and aminophenols and derivatives thereof such as 2-aminophenol and 3-aminophenol.

Specific examples of preferred amine compounds include guanidine, pyridine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, 2-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, and N-(2-aminoethyl)morpholine.

The above-described amine compounds may be used alone or in combination of two or more. A content of the amino compound may be ordinarily 0.001 to 10 mass %, preferably 0.005 to 5 mass %, more preferably 0.01 to 4 mass %, in a total solid content.

<Sensitizer>

A sensitizer may be used for attaining the high sensitivity. If the exposure light source emits an i-line, it is preferable to use a sensitizer formed from a naphthalene derivative or anthracene or its derivative, each of which is capable of improving sensitivity of a sulfonium salt photoacid generating agent and an iodonium salt photoacid generating agent. However, since the sensitizer can influence on the molding accuracy depending on a content and a compound type, it is preferable to appropriately select the type and the amount.

<Solvent>

A solvent to be used in the present invention is not particularly limited, and a conventionally known solvent may be used. Examples of the solvent include γ-butyrolactone, ethyl lactate, propylene carbonate, propyleneglycolmonomethylether acetate, methylisobutylketone, butyl acetate, methylamylketone, 2-heptanone, ethyl acetate, methylethylketone, diglyme, xylene, cyclohexanone, cyclopentanone, and the like.

The solvent may be contained in an amount of 5 to 99 parts by mass, preferably 10 to 95 pars by mass, to 100 parts by mass of the acid-polymerizable compound.

<Production Method>

Figure 2:
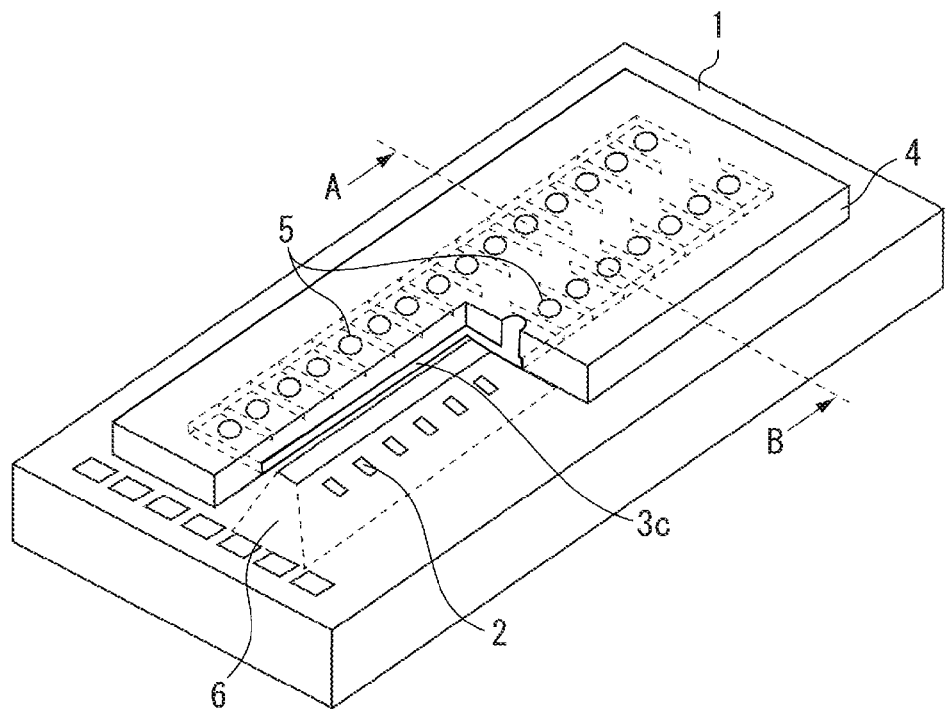
FIG. 2 is a perspective view schematically illustrating a liquid discharge head according to the exemplary embodiment of the present invention.

FIG. 2 is a perspective view schematically illustrating an example of a liquid discharge head formed by using the negative photosensitive resin composition according to the exemplary embodiment of the present invention. An example of the liquid discharge head illustrated in FIG. 2 is an inkjet recording head without particular limitation thereto. In the inkjet recording head illustrated in FIG. 2, an ink flow path forming layer 4 is formed on a substrate 1 having a plurality of energy generation elements 2, and ink discharge ports 5 and an ink flow path 3c that communicates with the ink discharge ports 5 and retains an ink are formed on the ink flow path forming layer 4. Further, an ink supply port 6 that supplies the ink to the ink flow path 3c is provided on the substrate 1.

Hereinafter, a method for producing the liquid discharge head according to the exemplary embodiment of the present invention will be described.

Figure 3:
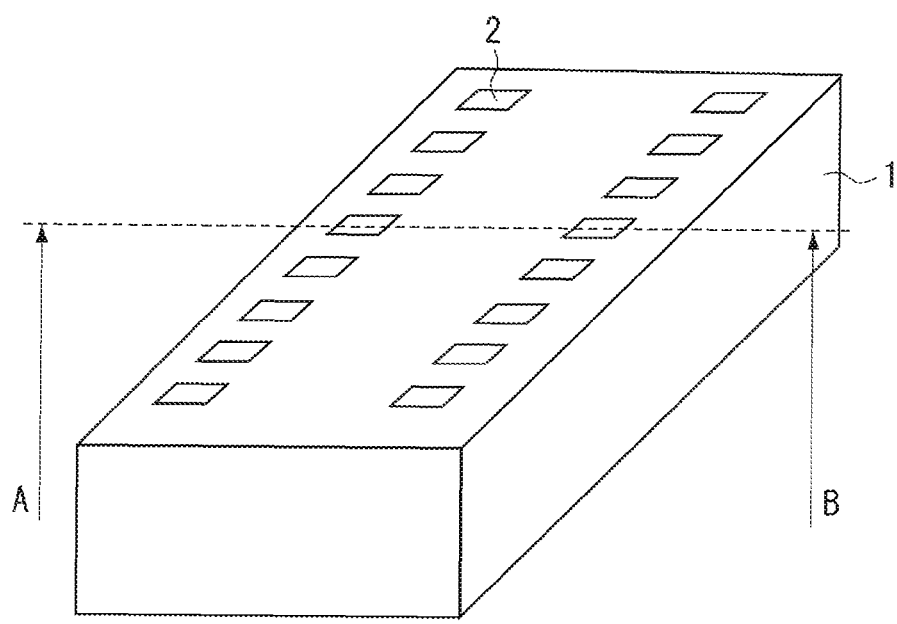
FIG. 3 is a perspective view schematically illustrating a substrate to be used for the liquid discharge head according to the exemplary embodiment of the present invention.

Referring to FIG. 3, the plurality of energy generation elements 2 are disposed on the substrate 1 at a predetermined pitch. Illustrated in FIGS. 4A to 4F are production steps in sectional views taken along line A-B of FIG. 2 or 3.

Hereinafter, each of the process steps will be described with reference to FIGS. 4A to 4F. A control signal input electrode (not illustrated) is connected to the energy generating elements 2 to operate the elements 2.

Figure 4A:
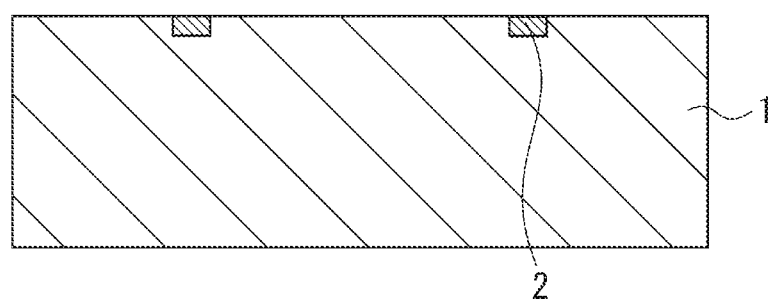
FIG. 4A is a sectional view illustrating a process step of a production process of the liquid discharge head according to the exemplary embodiment of the present invention.

Referring to FIG. 4A, the substrate 1 having the energy generation elements 2 is prepared. The substrate 1 may be preferably a Si substrate. Particularly, the substrate 1 may be preferably a silicon single crystal, and, in the case of performing perforation of thorough-holes of the substrate 1 by anisotropic etching, the substrate 1 may be preferably a silicon single crystal having a crystal orientation of 100. In the case of performing the perforation of through-holes of the substrate 1 by dry etching, sandblasting, or using laser, a silicon single crystal having a crystal orientation of 110 or the like may be used.

The energy generation element 2 is not particularly limited insofar as the energy generation element 2 is capable of imparting discharge energy for discharging ink droplets to the ink and discharging the ink droplets from the ink discharge port. If a heating resistance element is used as the energy generation element 2, for example, the discharge energy is generated by causing a state change of the ink by heating the ink in the vicinity of the heating resistance element by the heating resistance element.

Figure 4B:
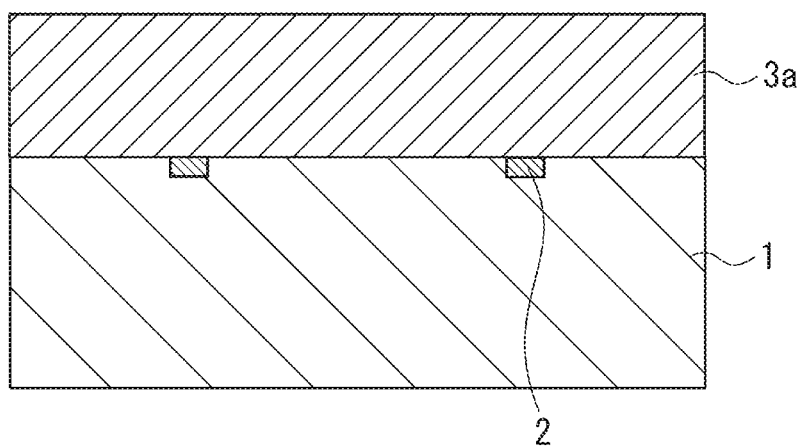
FIG. 4B is a sectional view illustrating a process step of the production process of the liquid discharge head according to the exemplary embodiment of the present invention.

Referring to FIG. 4B, a soluble resin composition is applied on the substrate 1 to form an ink flow path pattern layer 3a. As a method for forming the ink flow path pattern layer 3a, a positive photosensitive resin, for example, is appropriately dissolved into a solvent and the applied on the substrate 1 by spin coating or the like. After that, heating is performed to form the ink flow path pattern layer 3a. A thickness of the ink flow path pattern layer 3a may be equal to a height of a desired ink flow path and is not particularly limited. For example, the thickness may be preferably 2 to 50 μm (micrometers).

Figure 4C:
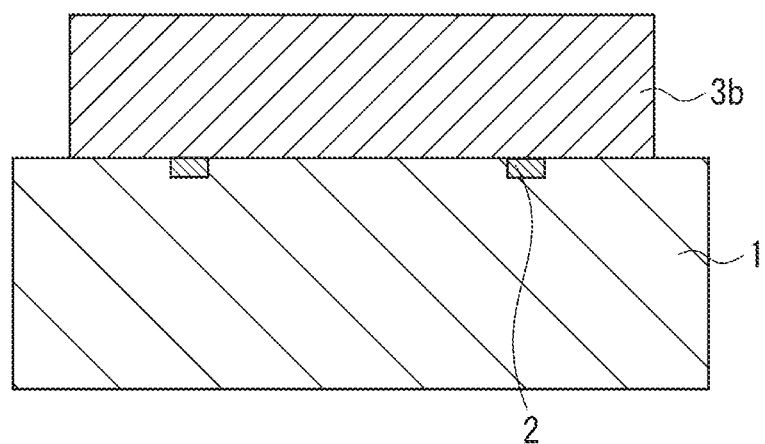
FIG. 4C is a sectional view illustrating a process step of the production process of the liquid discharge head according to the exemplary embodiment of the present invention.

Referring to FIG. 4C, an ink flow path pattern 3b is formed by irradiating the ink flow path pattern layer 3a with radiation, followed by development.

Next, the ink flow path forming layer 4 formed from the negative photosensitive resin composition of the present invention is formed on the ink flow path pattern 3b and the substrate 1. A thickness of the ink flow path forming layer 4 may be preferably 2 μm or more as a thickness on the ink flow path pattern 3b. Further, the thickness of the ink flow path forming layer 4 may be preferably 100 μm or less as a thickness on the ink flow path pattern 3b though the thickness is not particularly limited insofar as the thickness is within a range that does not impair the developability of the ink discharge port part.

Figure 4D:
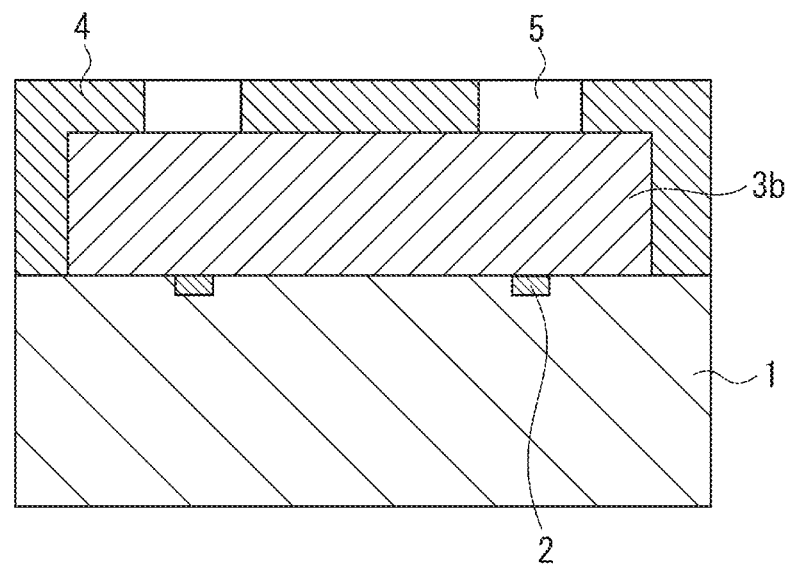
FIG. 4D is a sectional view illustrating a process step of the production process of the liquid discharge head according to the exemplary embodiment of the present invention.

Referring to FIG. 4D, the ink flow path forming layer 4 is irradiated with radiation, followed by development using MIBK (methylisobutylketone) or the like. Further, the ink discharge ports 5 are formed by performing a rinsing treatment with IPA (isopropyl alcohol).

Figure 4E:
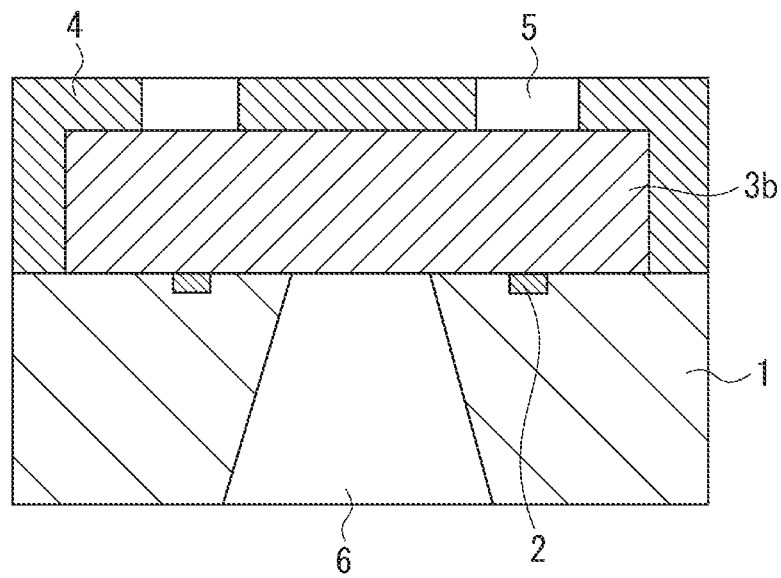
FIG. 4E is a sectional view illustrating a process step of the production process of the liquid discharge head according to the exemplary embodiment of the present invention.

Referring to FIG. 4E, the ink supply port 6 is formed by employing an appropriate method such as an etching treatment.

Figure 4F:
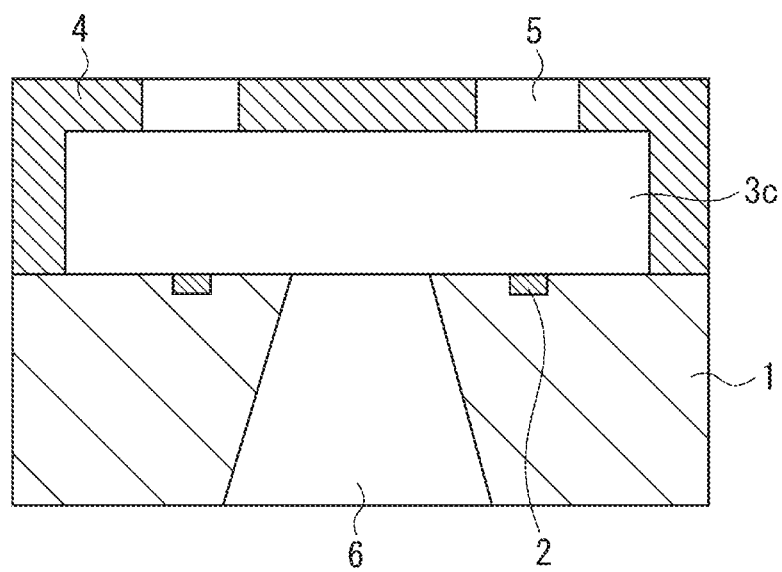
FIG. 4F is a sectional view illustrating a process step of the production process of the liquid discharge head according to the exemplary embodiment of the present invention.

As illustrated in FIG. 4F, the ink flow path pattern 3b is removed by dissolving the ink flow path pattern 3b into an appropriate solvent. The appropriate solvent used herein may be an alkali solution or an organic solvent. Further, a heat treatment may be performed at 200° C. for one hour by using an oven to cure the ink flow path forming layer 4.

After that, the substrate 1 is cut and separated by using a dicing saw or the like to obtain chips, and electrical bonding for driving the energy generation elements 2 is performed. Further, a chip tank member for ink supply is connected to obtain the inkjet recording head.

The above-described method is not limited to the inkjet recording head production method and effective as a pattern formation method for forming a hollow pattern.

Further, though the inkjet recording head is used as the example to which the present invention is applied in the foregoing description, the applicable range of the present invention is not limited to the inkjet recording head, and the present invention is applicable to biochip fabrication and a production of a liquid discharge head for electronic circuit printing. Examples of the liquid discharge head include a head for color filter production in addition to the inkjet recording head.

Hereinafter, examples of the present invention will be described, but the invention is not limited to the examples.

Examples 1 to 9

Comparative Examples 1 to 3

According to compositions (unit is mass %) illustrated in Tables 1 to 4, polyfunctional epoxy resins as the component (a), photoacid generating agents as the component (b), the components (c), a solvent, a sensitizer as required, and the component (d) are blended to obtain negative photosensitive resin compositions. In Tables 1 to 4, the unit mass % is of a solid content (100% as a total solid content), and 70 parts by mass of a blended solvent having a ratio of propyleneglycol-monomethylether acetate/propylene carbonate=20:1 was added as the solvent.

After applying each of the negative photosensitive resin compositions on a support body made of a silicon wafer by using a spin coater, pre-bake drying was performed at 90° C. for 5 minutes, thereby obtaining a negative photosensitive resin composition layer having a film thickness of 20 μm. After pre-baking, patterning exposure was performed via a mask on which a desired pattern is drawn by using FPA-3000 i5+ (i-line stepper, manufactured by Cannon Inc.), and post-exposure baking was performed by using a hot plate at 90° C. for 4 minutes. After that, a development treatment was performed by using CDS-630+(manufactured by Cannon Inc.).

Subsequently, a resin pattern after the development underwent post-baking at 140° C. for one hour and 300° C. for 20 minutes by using an oven, thereby obtaining a resist pattern cured on the support body.

<Evaluation>

A method for estimating acid strengths obtained by converting an anion portion of the photoacid generating agent (b) and an anion portion of the salt exchanging agent (c) into acids by using measured values will be described.

A negative photosensitive resin composition was prepared by blending 65 mass % of EHPE 3150 as the component (a), 2 mass % of a photoacid generating agent illustrated in Table 5 as the component (b), 35 mass % of a blended solvent having a ratio of propyleneglycolmonomethylether acetate/propylene carbonate=20:1 as the solvent, 1 mass % of 9,10-diethoxyanthracene as the sensitizer, and 0.02 mass % of triethanolamine as the component (d), and a resist pattern was obtained by the above-described method. Stepwise i-line exposure within a range of 500 J/m$^2$ to 40000 J/m$^2$ was performed during the exposure process, and an exposure amount required for forming a circle pattern having a diameter of 16 μm with a circular nozzle discharge port having a bore having a diameter of 16 μm as mask design dimension was measured. The detected exposure amount is illustrated in the item of exposure amount in Table 5. The exposure amounts were listed in ascending order to illustrate a rank order. The rank order is illustrated in the item of rank order of acid strength in Table 5. It is indicated that the smaller the exposure amount, i.e., the higher the sensitivity, the higher the acid strength of the acid generated from the photoacid generating agent (b) is. As a result of a comparison among the acid strengths detected by converting the anion portions into acids based on the obtained results, it was revealed that there is a relationship of (b-1)>(b-12)>(b-23)>(b-27)>PF$_6$>CH$_3$COO. The relationship is applicable to evaluation of the anion portions of the salt exchanging agents (c) in the same manner as the evaluation of the anion portions of the photoacid generating agents (b).

In evaluation of molding accuracy, in a bore of an oval nozzle discharge port having a major axis of 20 μm and a minor axis of 16 μm as design dimensions, a model pattern that was bridged by a line pattern (c) having a width of 3 μm along the minor axis was transcribed to form a negative resist pattern (see FIG. 1). The part at which the oval and the bridge line pattern interest with each other was observed by using a scanning electron microscope (SEM) to measure resolution. As illustrated in FIG. 1, when an end part of a crescent shape in the case of forming a resist pattern in faithful according to a mask pattern is "a", a distance (b) from "a" to the part at which the bridging line pattern and the actually resolved pattern intersect with each other is the molding accuracy (unit is micrometer). Accordingly, molding accuracy is 0 μm, i.e., the pattern is identical to the mask design dimension, when the actual pattern is resolved to the end part (a) of the crescent shape. However, when the molding accuracy is deteriorated, a negative substance remains at the end part of the crescent shape. A value of the molding accuracy is determined by the degree of a range of the negative substance.

In evaluation of heat resistance, post-baking was performed at 140° C. for one hour and then at 300° C. for 20 minutes by using an oven, and coloring was confirmed by visual examination of the resist pattern cured on the support body. If there was no coloring, it was determined that good heat resistance was attained. The case of coloring of brown, dark brown, or black was determined to be deterioration of heat resistance. In Tables 1 to 4, the good heat resistance is indicated by a circle mark, and the deterioration of heat resistance is indicated by an x-mark.

TABLE 1

| | | Examples | | |
|---|---|---|---|---|
| | Components | 1 | 2 | 3 |
| (a) Cationically polymerizable compound | (a-4) | — | — | — |
| | (a-3) | 95.88 | — | — |
| | (a-2) | — | 96.48 | 95.9 |
| | (a-1) | — | — | — |
| (b) Photoacid generating agent | TPS2/(b-1) | 3 | 3 | 3 |
| | TPS2/(b-12) | — | — | — |
| | TPS1/(b-23) | — | — | — |
| | TPS2/(b-27) | — | — | — |
| (c) Salt exchanging agent | (c-80) | — | — | — |
| | (c-55) | 1.1 | — | — |
| | (c-3) | — | 0.5 | — |
| | (c-17) | — | — | — |
| | (c-29) | — | — | 0.08 |
| Sensitizer | | — | — | 1 |
| (d) Amine compound | (d-1) | 0.02 | 0.02 | 0.02 |
| number of moles of component (c)/number of moles of component (b) generating acid having highest acid strength | | 1.10 | 0.48 | 0.26 |
| Heat resistance evaluation | | ○ | ○ | ○ |
| Molding accuracy (μm) | | <0.5 | 0.8 | 1.5 |

TABLE 2

| | | Examples | | |
|---|---|---|---|---|
| | Components | 4 | 5 | 6 |
| (a) Cationically polymerizable compound | (a-4) | — | — | — |
| | (a-3) | 94.98 | — | 92.80 |
| | (a-2) | — | — | — |
| | (a-1) | — | 89.98 | — |
| (b) Photoacid generating agent | TPS2/(b-1) | — | 3 | 3 |
| | TPS2/(b-12) | 3 | 0.5 | — |
| | TPS1/(b-23) | — | 0.5 | — |
| | TPS2/(b-27) | — | 5 | — |
| (c) Salt exchanging agent | (c-80) | — | — | — |
| | (c-55) | 2 | — | — |
| | (c-3) | — | 1 | — |
| | (c-17) | — | — | 4.2 |
| | (c-29) | — | — | — |
| Sensitizer | | — | — | — |
| (d) Amine compound | (d-1) | 0.02 | 0.02 | — |
| number of moles of component (c)/number of moles of component (b) generating acid having highest acid strength | | 1.03 | 0.97 | 4.09 |
| Heat resistance evaluation | | ○ | ○ | ○ |
| Molding accuracy (μm) | | <0.5 | 1.2 | <0.5 |

TABLE 3

| | | Examples | | |
|---|---|---|---|---|
| | Components | 7 | 8 | 9 |
| (a) Cationically polymerizable compound | (a-4) | — | — | 15 |
| | (a-3) | 96.60 | 96.44 | 81.48 |
| | (a-2) | — | — | — |
| | (a-1) | — | — | — |
| (b) Photoacid generating agent | TPS2/(b-1) | — | 3 | 3 |
| | TPS2/(b-12) | — | — | — |
| | TPS1/(b-23) | 3 | — | — |
| | TPS2/(b-27) | — | — | — |

TABLE 3-continued

|  | Components | Examples 7 | 8 | 9 |
|---|---|---|---|---|
| (c) Salt exchanging agent | (c-80) | — | — | — |
|  | (c-55) | — | — | 0.50 |
|  | (c-3) | 0.38 | 0.54 | — |
|  | (c-17) | — | — | — |
|  | (c-29) | — | — | — |
| Sensitizer |  | — | — | — |
| (d) Amine compound | (d-1) | 0.02 | 0.02 | 0.02 |
| number of moles of component (c)/number of moles of component (b) generating acid having highest acid strength |  | 0.24 | 0.52 | 0.50 |
| Heat resistance evaluation |  | ○ | ○ | ○ |
| Molding accuracy (μm) |  | 0.9 | 0.6 | 0.6 |

TABLE 4

|  | Components | Comparative Examples 1 | 2 |
|---|---|---|---|
| Cationically polymerizable compound | (a-4) | — | — |
|  | (a-3) | 93.00 | — |
|  | (a-2) | — | 97.00 |
|  | (a-1) | — | — |
| Photoacid generating agent | TPS2/(b-1) | — | — |
|  | TPS2/(b-12) | — | — |
|  | TPS1/(b-23) | 3 | 3 |
|  | TPS2/(b-27) | — | — |
| Salt exchanging agent | (c-80) | 4 | — |
|  | (c-55) | — | — |
|  | (c-3) | — | — |
|  | (c-17) | — | — |
|  | (c-29) | — | — |
| Sensitizer |  | — | — |
| (d) Amine compound | (d-1) | — | — |
| number of moles of component (c)/number of moles of component (b) generating acid having highest acid strength |  | 1.24 | — |
| Heat resistance evaluation |  | x | x |
| Molding accuracy (μm) |  | <0.5 | 2.5 |

(a-1): Epiclon N-865 (manufactured by DIC Corporation, trade name)
(a-2): JER157S70 (manufactured by Japan Epoxy Resin Co., Ltd., trade name)
(a-3): EHPE 3150 (manufactured by Daicel Chemical Industries, Ltd., trade name)
TPS1: compound expressed by formula (E-1)
[Chem. 10]

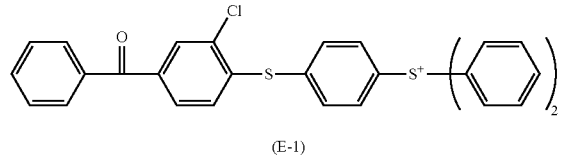

(E-1)
TPS2: compound expressed by formula (E-2)
[Chem. 11]

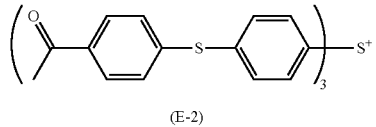

(E-2)
(c-80):
[Chem. 12]

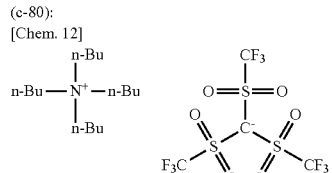

(d-1): Triethanolamine
Sensitizer: 9,10-diethoxyanthracene

TABLE 5

| No. | (b) Photoacid generating agent | Exposure amount (J/m$^2$) | Rank order of acid strength |
|---|---|---|---|
| 1 | TPS1/(b-1) | 1000 | 1 |
| 2 | TPS1/(b-12) | 2000 | 2 |
| 3 | TPS1/(b-23) | 3500 | 3 |
| 4 | TPS1/(b-27) | 10000 | 4 |
| 5 | TPS1/PF$_6^-$ | 30000 | 5 |
| 6 | TPS1/CH$_3$COO$^-$ | >40000 | 6 |

TPS1: Triphenylsulfonium (compound expressed by the following formula)
[Chem. 13]

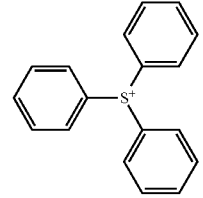 [SMILES: c1ccc([S+](c2ccccc2)c2ccccc2)cc1]

Examples 1 to 9 were capable of forming patterned cured matters having good heat resistance. The molding accuracy was 1.5 μm or less, which was minute.

In contrast, as illustrated in Comparative Example 1, it was impossible to attain both of heat resistance and minute molding accuracy when the component (b) and the component (c) do not satisfy the relationship of Formula 1.

Further, as illustrated in Comparative Example 2, deterioration of heat resistance was observed if the component (c) was not added.

Further, evaluations were separately conducted in the same manner by adding antimony trioxide, red phosphorus, and tin oxide, which are known as a flame retardant in place of the salt exchanging agent (c). However, since the inorganic compounds were not dissolved into the solvent and the photosensitive resin composition solution, actual evaluations were not finalized.

Further, a composition was prepared in the same manner as in Example 1 except for adding trimethyl ammonium hydroxide, which is known as an ammonium compound, in the same amount in place of the salt exchanging agent (c) to conduct the evaluations. However, no pattern was formed. It is inferred that strong basicity of trimethyl ammonium hydroxide inhibited image formation.

As described in the foregoing, the negative photosensitive resin composition according to the exemplary embodiments enables forming a pattern having high resistance and excellent molding accuracy. Consequently, the negative photosensitive resin composition according to the exemplary embodiments can be suitably used for various devices on which microfabrication for MEMS and the like is performed.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2010-024682 filed Feb. 5, 2010, which is hereby incorporated by reference herein in its entirety.

The invention claimed is:
1. A photosensitive resin composition comprising:
a cationically polymerizable compound;
a photoacid generating agent having an anion portion and a cation portion; and a salt having a cation portion having either one of a quaternary ammonium structure and a quaternary phosphonium structure and an anion portion, wherein the anion portion of the salt is exchanged with the anion portion of a first acid derived from the anion portion of the photoacid generating agent to form a second acid having acid strength that is lower than acid strength of the first acid, wherein the photoacid generating agent includes a plurality of types of compounds, and a number of moles of the salt is larger than ¼ times of a number of moles of the photoacid generating agent generating the acid having the highest acid strength among the plurality of types of compounds.

2. The photosensitive resin composition according to claim 1, wherein the second acid formed by the salt is a fluorine atom-containing antimonic acid, a fluorine atom-containing phosphoric acid, a fluorine atom-containing boric acid, a fluorine atom-containing sulfonic acid, or a carboxylic acid.

3. The photosensitive resin composition according to claim 1, wherein the photoacid generating agent includes a plurality of types of compounds, and a number of moles of the salt is larger than ½ times of a number of moles of the photoacid generating agent generating the acid having the highest acid strength among the plurality of types of compounds.

4. The photosensitive resin composition according to claim 1, wherein the photoacid generating agent includes a plurality of types of compounds, and a number of moles of the salt is larger than a number of moles of the photoacid generating agent generating the acid having the highest acid strength among the plurality of types of compounds.

5. The photosensitive resin composition according to claim 1, further comprising an amine compound.

6. The photosensitive resin composition according to claim 1, wherein the cationically polymerizable compound is an epoxy resin.

7. The photosensitive resin composition according to claim 1, wherein the second acid is a fluorine atom-containing antimonic acid, a fluorine atom-containing phosphoric acid, or a fluorine atom-containing boric acid.

8. A pattern formation method comprising:

preparing a substrate on which a photosensitive resin composition is provided, the photosensitive resin composition comprising a cationically polymerizable compound, a photoacid generating agent having an anion portion and a cation portion, and a salt having a cation portion having either one of a quaternary ammonium structure and a quaternary phosphonium structure and an anion portion, wherein the anion portion of the salt is exchanged with the anion portion of a first acid derived from the anion portion of the photoacid generating agent to form a second acid having acid strength that is lower than acid strength of the first acid;

exposing a part of the photosensitive resin composition to light to cure the exposed part; and heating the cured part obtained by the curing, wherein the photoacid generating agent includes a plurality of types of compounds, and a number of moles of the salt is larger than ¼ times of a number of moles of the photoacid generating agent generating the acid having the highest acid strength among the plurality of types of compounds.

9. The pattern formation method according to claim 8, wherein the second acid formed by the salt is a fluorine atom-containing antimonic acid, a fluorine atom-containing phosphoric acid, a fluorine atom-containing boric acid, a fluorine atom-containing sulfonic acid, or a carboxylic acid.

10. The pattern formation method according to claim 8, wherein the cationically polymerizable compound is an epoxy resin.

11. A liquid discharge head comprising:

a discharge port member provided with a discharge port for discharging a liquid, wherein the discharge port member is formed of a cured matter of a resin composition comprising a cationically polymerizable compound, a photoacid generating agent having an anion portion and a cation portion, and a salt having a cation portion having either one of a quaternary ammonium structure and a quaternary phosphonium structure and an anion portion, wherein the anion portion of the salt is exchanged with the anion portion of a first acid derived from the anion portion of the photoacid generating agent to form a second acid having acid strength that is lower than acid strength of the first acid, and wherein the photoacid generating agent includes a plurality of types of compounds, and a number of moles of the salt is larger than ¼ times of a number of moles of the photoacid generating agent generating the acid having the highest acid strength among the plurality of types of compounds.

12. The liquid discharge head according to claim 11, wherein the second acid formed by the salt is a fluorine atom-containing antimonic acid, a fluorine atom-containing phosphoric acid, a fluorine atom-containing boric acid, a fluorine atom-containing sulfonic acid, or a carboxylic acid.

13. The liquid discharge head according to claim 11, wherein the cationically polymerizable compound is an epoxy resin.

* * * * *